United States Patent [19]

Merrill

[11] Patent Number: 5,721,425
[45] Date of Patent: Feb. 24, 1998

[54] ACTIVE PIXEL SENSOR CELL THAT REDUCES THE EFFECT OF 1/F NOISE, INCREASES THE VOLTAGE RANGE OF THE CELL, AND REDUCES THE SIZE OF THE CELL

[75] Inventor: Richard Billings Merrill, Daly City, Calif.

[73] Assignee: National Semiconductor Corporation, Santa Clara, Calif.

[21] Appl. No.: 609,553

[22] Filed: Mar. 1, 1996

[51] Int. Cl.$^6$ .................. H01L 31/062; H01L 31/113
[52] U.S. Cl. .................. 250/214.1; 257/290; 257/291; 257/292; 257/461; 257/465
[58] Field of Search .................. 257/290, 291, 257/292, 461, 465; 250/214 R, 214.1

[56] References Cited

U.S. PATENT DOCUMENTS

| | | | |
|---|---|---|---|
| 5,191,398 | 3/1993 | Mutoh | 257/216 |
| 5,289,023 | 2/1994 | Mead | 257/291 |
| 5,408,113 | 4/1995 | Kanno et al. | 257/292 |
| 5,625,210 | 4/1997 | Lee et al. | 257/292 |

OTHER PUBLICATIONS

Fossum, E., *Active–pixel sensors challenge CCSs*, Technology Guide: Detector Handbook, *Laser Focus World*, Jun. 1993, pp. 83–87, Pasadena, CA.

Mendis, S. et al., *Progress in CMOS Active Pixel Image Sensors*, SPIE vol. 2172, (1994) Center for Space Microelectronics Tech., Jet Propulsion Laboratory, California Institute of Technology, pp. 19–29, paper presented at a Conference on Feb. 7–8, 1994 in San Jose, CA.

Kawashima, H. et al., *A 1/4 Inch Format 250K Pixel Amplified MOS Image Sensor Using CMOS Process*, 1993 IEEE, pp. 575–578, Tokyo, Japan, no month.

Dickinson, A. et al., *A 256 ×256 CMOS Active Pixel Image Sensor with Motion Detection*, ISSCC95/Session 13/Image Sensors and Systems/Paper TP 13.5, 1995 IEEE International Solid–State Circuits Conf., Feb. 16, 1995, Pasadena, CA.

*Primary Examiner*—Ngân V. Ngô
*Attorney, Agent, or Firm*—Limbach & Limbach L.L.P.

[57] ABSTRACT

The accuracy of an active pixel sensor cell is increased by utilizing a reset diode in lieu of the reset transistor that is conventionally used to reset the voltage on the photodiode of the cell. The reset diode, which is largely unaffected by 1/f noise, consistently resets the photodiode to a substantially constant voltage as opposed to the reset transistor which varies the reset voltage on the photodiode across integration periods due to the effect of 1/f noise. In the present invention, the photodiode is formed by forming a well region of a second conductivity type in a substrate of a first conductivity type. The reset diode is then formed by forming a reset region of the first conductivity type in the well region.

2 Claims, 2 Drawing Sheets

ACTIVE PIXEL SENSOR CELL THAT REDUCES THE EFFECT OF 1/F NOISE, INCREASES THE VOLTAGE RANGE OF THE CELL, AND REDUCES THE SIZE OF THE CELL

BACKGROUND OF THE INVENTION

1. Field of the Invention

The present invention relates to active pixel sensor cells and, more particularly, to an active pixel sensor cell that reduces the effect of 1/f noise, increases the voltage range of the cell, and reduces the size of the cell.

2. Description of the Related Art

Charge-coupled devices (CCDs) have been the mainstay of conventional imaging circuits for converting a pixel of light energy into an electrical signal that represents the intensity of the light energy. In general, CCDs utilize a photogate to convert the light energy into an electrical charge, and a series of electrodes to transfer the charge collected at the photogate to an output sense node.

Although CCDs have many strengths, which include a high sensitivity and fill-factor, CCDs also suffer from a number of weaknesses. Most notable among these weaknesses, which include limited readout rates and dynamic range limitations, is the difficulty in integrating CCDs with CMOS-based microprocessors.

To overcome the limitations of CCD-based imaging circuits, more recent imaging circuits use active pixel sensor cells to convert a pixel of light energy into an electrical signal. With active pixel sensor cells, a conventional photodiode is typically combined with a number of active transistors which, in addition to forming an electrical signal, provide amplification, readout control, and reset control.

FIG. 1 shows an example of a CMOS active pixel sensor cell 10. As shown in FIG. 1, cell 10 includes a photodiode 12, a reset transistor 14, whose source is connected to photodiode 12, a buffer transistor 16, whose gate is connected photodiode 12, and a row select transistor 18, whose drain is connected in series to the source of buffer transistor 16.

Operation of active pixel sensor cell 10 is performed in three steps: a reset step, where cell 10 is reset from the previous integration cycle; an image integration step, where the light energy is collected and converted into an electrical signal; and a signal readout step, where the signal is read out.

As shown in FIG. 1, during the reset step, the gate of reset transistor 14 is briefly pulsed with a reset voltage (5 volts) which resets photodiode 12 to an initial integration voltage which is equal to $V_R-V_{T14}$, where $V_R$ represents the reset voltage, and $V_{T14}$ represents the threshold voltage of reset transistor 14.

During integration, light energy, in the form of photons, strikes photodiode 12, thereby creating a number of electron-hole pairs. Photodiode 12 is designed to limit recombination between the newly formed electron-hole pairs. As a result, the photogenerated holes are attracted to the ground terminal of photodiode 12, while the photogenerated electrons are attracted to the positive terminal of photodiode 12 where each additional electron reduces the voltage on photodiode 12.

At the end of the integration period, the final voltage on photodiode 12 is equal to $V_R-V_{T14}-V_S$, where $V_S$ represents the change in voltage due to the absorbed photons. Thus, the number of photons which were absorbed by photodiode 12 during the image integration period can be determined by subtracting the voltage at the end of the integration period from the voltage at the beginning of the integration period, thereby yielding the value $V_S$, i.e., $((V_R-V_{T14})-(V_R-V_{T14}-V_S))$.

Following the image integration period, active pixel sensor cell 10 is read out by turning on row select transistor 18 (which has been turned off until this point). When row select transistor 18 is turned on, the reduced voltage on photodiode 12 reduces the voltage on the gate of buffer transistor 16 which, in turn, reduces the magnitude of the current flowing through transistors 16 and 18. The reduced current level is then detected by conventional current detectors.

One of the problems with active pixel sensor cell 10, however, is that the period used to integrate the image, e.g., 30 mS, introduces 1/f noise into the cell. In the FIG. 1 cell, the 1/f noise principally functions to randomly vary the threshold voltage of reset transistor 14.

As a result, the voltage on photodiode 12 at the beginning of the integration period is more properly defined by $V_R-V_{T14}-V_\alpha$, where $V_\alpha$ represents the change in threshold voltage due to 1/f noise.

Thus, the variations in the threshold voltage of the reset transistor add an error term $V_\alpha$ which erroneously yields $V_S-V_\alpha$, i.e., $((V_R-V_{T14}-V_\alpha)-(V_R-V_{T14}-V_S)=(V_S-V_\alpha))$, as the the number of absorbed photons. This error, in turn, erroneously changes the magnitude of the current output by transistors 16 and 18 during the read out step, thereby limiting the accuracy of the cell.

Thus, to reduce the introduction of errors into the output current, there is a need for an active pixel sensor cell that reduces 1/f-noise variations in the threshold voltage of the reset transistor.

SUMMARY OF THE INVENTION

The present invention provides an active pixel sensor cell that reduces the introduction of errors into the output current of the cell as a result of 1/f noise. The accuracy of an active pixel sensor cell is limited in part by variations in the threshold voltage of the reset transistor that is used to reset the voltage on the photodiode. The threshold voltage variations, which are principally due to 1/f noise, vary the reset voltage on the photodiode which, in turn, introduces errors into the currents output by the cell. In the present invention, variations in the threshold voltage are substantially eliminated by utilizing a reset diode, which is largely unaffected by 1/f noise, in lieu of the reset transistor.

In the present invention, an active pixel sensor cell includes a well region of a second conductivity type which is formed in a substrate of a first conductivity type, and a buffer transistor which has a gate connected to the well region.

In accordance with the present invention, the active pixel sensor cell also includes a reset region of the first conductivity type which is formed in the well region. By forming a reset region in the well region, a reset diode is formed which, when connected to a reset voltage pulse, changes the voltage on the well region.

A better understanding of the features and advantages of the present invention will be obtained by reference to the following detailed description and accompanying drawings which set forth an illustrative embodiment in which the principals of the invention are utilized.

DETAILED DESCRIPTION

Figure 2:
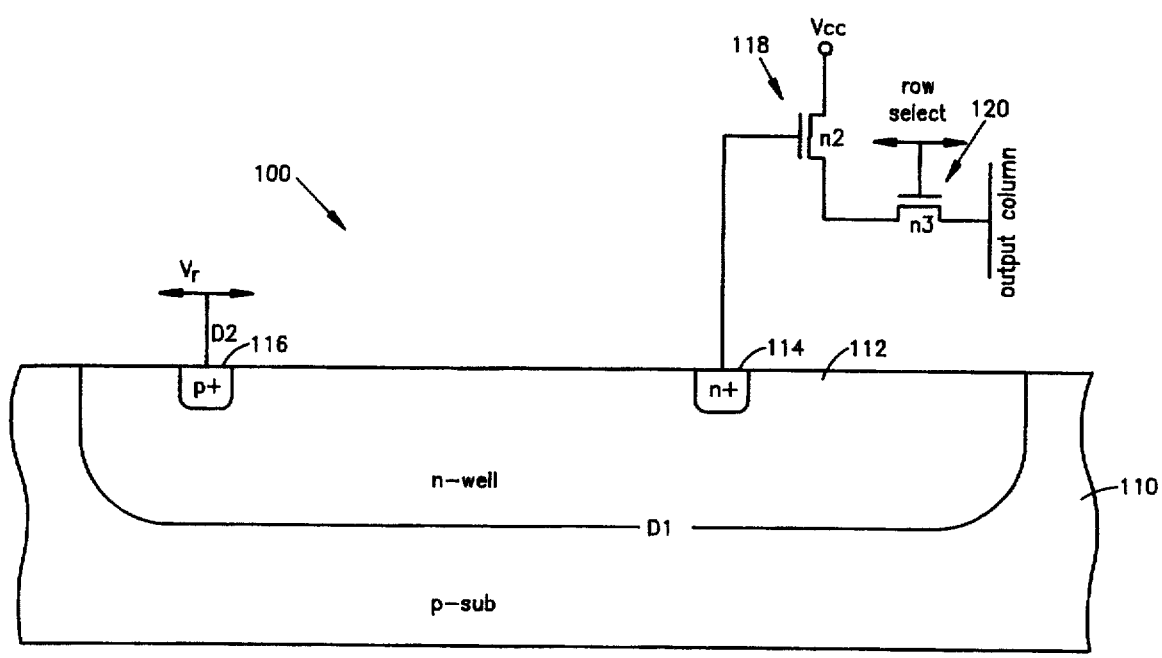
FIG. 2 is a cross-sectional diagram illustrating an active pixel sensor cell 100 in accordance with the present invention.

FIG. 2 shows a cross-sectional diagram of an active pixel sensor cell 100 in accordance with the present invention. As described in greater detail below, cell 100 reduces the effect of 1/f noise by utilizing a reset diode to reset the photodiode of the cell 100 in lieu of a reset transistor.

As shown in FIG. 2, cell 100 includes an n-well 112, which is formed in a semiconductor substrate 110 of p-type conductivity, an n+ contact region 114 formed in n-well 112, and a p+ region 116 formed in n-well 112. In addition, as further shown in FIG. 2, cell 100 also includes a buffer transistor 118 and a row select transistor 120.

In operation, prior to image integration, the voltage on n-well 112 is reset. In accordance with the present invention, the voltage on n-well 112 is reset by utilizing the p+/n– diode that results from the formation of p+ region 116 in n-well 112.

Thus, by applying a positive reset voltage pulse Vr to p+ region 116, the electrostatic potential barrier at the p-n junction is lowered which allows electrons to diffuse to p+ region 116. This loss of electrons, in turn, raises the potential of n-well 112. N-well 112 is then floated by the falling edge of the reset voltage pulse Vr.

As a result of increasing the voltage on n-well 112, the junction between n-well 112 and p-type substrate 110, which is connected to ground, is reverse-biased at the beginning of each integration cycle.

Once the voltage on n-well 112 has been reset, the next step is to begin image integration. During image integration, photons strike the photodiode formed from n-well 112 and p-type substrate 110, thereby creating a number of electron-hole pairs in both n-well 112 and the underlying p-type substrate 110. The number of electron-hole pairs is a function of the intensity of the received light energy.

The holes formed in n-well 112, in turn, diffuse to the p-n junction where they are swept to the p-type substrate 110 under the influence of the electric field. Similarly, the electrons formed in p-type substrate 110 diffuse to the p-n junction where they are swept to n-well 112 and collected in n+ region 114.

Thus, with the addition of each photogenerated electron in n-well 112, the voltage on n+ region 114, which functions as a contact region, is correspondingly reduced. (The depth of the junction as well as the thickness of substrate 110 are designed to limit recombination of the photogenerated electron-hole pairs).

As a result, the photodiode varies the voltage on n+ region 114 in a manner which is proportional to the photon absorption rate. The remainder of cell 100 operates as described above with buffer transistor 118 varying the magnitude of the output current in response to the voltage on n+ region 114, and row select transistor 120 enabling the output current at the end of each integration period.

Thus, in accordance with the present invention, an active pixel sensor cell has been described where a reset diode, which results from forming p+ region 116 in n-well 112, is utilized to replace the reset transistor that is conventionally used to reset the photodiode. The reset diode, however, experiences very little, if any, variation due to 1/f noise. As a result, the present invention eliminates substantially all of the threshold voltage variations introduced by a conventional reset transistor.

Another significant advantage of the present invention is that by utilizing a reset diode in lieu of a reset transistor, the voltage range of the active pixel sensor cell can be significantly increased.

Figure 1:
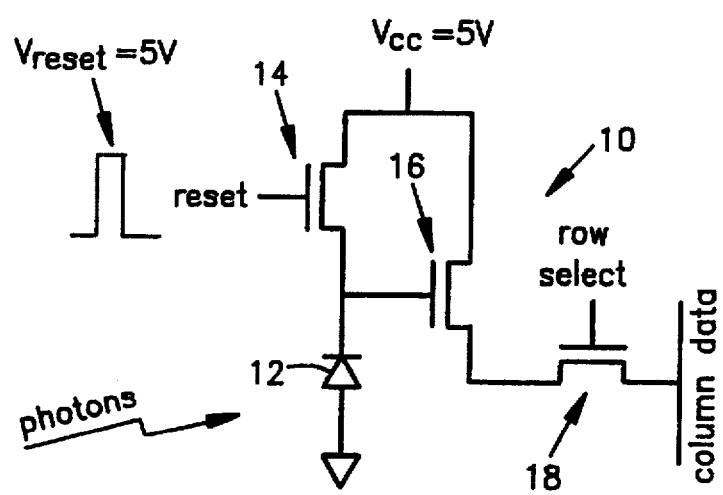
FIG. 1 is a cross-sectional diagram illustrating an active pixel sensor cell 10.

As described above with respect to FIG. 1, the initial integration voltage on a photodiode in a conventional active pixel sensor cell is defined by $V_R - V_{T14}$, where $V_R$ represents the reset voltage, and $V_{T14}$ represents the threshold voltage of reset transistor 14. Due to the so-called "body-effect", the threshold voltage of the reset transistor is typically about 1.5 volts. Thus, when a five volt reset voltage pulse is utilized, the initial integration voltage is typically around 3.5 volts (5V–1.5V).

The voltage drop across the reset diode 116/112, however, is approximately 0.6 volts. Thus, when a five volt reset voltage pulse is applied, the initial integration voltage is increased to approximately 4.4 volts. Thus, the reset diode 116/112 provides a nearly a 25% increase in the voltage range of the cell.

Another advantage provided by the present invention is that a significantly smaller amount of silicon "real estate" is required to form the reset diode over that required to form a conventional reset transistor. As a result, the size of active pixel sensor cell 100 is smaller than conventional active pixel sensor cells.

It should be understood that various alternatives to the embodiment of the invention described herein may be employed in practicing the invention. For example, although the operation of the present invention has been described with respect to an n+/p– photodiode and a p+/n reset diode, the present invention applies equally well to a p+/n– photodiode and an n+/p reset diode.

Thus, it is intended that the following claims define the scope of the invention and that methods and structures within the scope of these claims and their equivalents be covered thereby.

What is claimed is:

1. A method for converting light energy into a pixel signal with an active pixel sensor cell formed in a semiconductor substrate of a first conductivity type, wherein the active pixel sensor cell includes:

a well region of a second conductivity type formed in the substrate;

a reset region of the first conductivity type formed in the well region;

a buffer transistor having a gate connected to the well region; and a row select transistor connected to the buffer transistor, the row select transistor having a gate, the method comprising the steps of:

applying a first voltage to the substrate;

resetting the well region to a voltage which is greater than the first voltage; and applying a read voltage to the gate of the row select transistor for a predetermined time a predefined time after the well region is reset.

2. The method of claim 1 wherein the resetting step includes the step of applying a second voltage to the reset region for a predefined time, wherein the second voltage is greater than the first voltage.

\* \* \* \* \*